(12) United States Patent
Li et al.

(10) Patent No.: US 11,703,529 B2
(45) Date of Patent: Jul. 18, 2023

(54) VOLTAGE MEASUREMENT DEVICE, VOLTAGE MEASUREMENT METHOD, AND STORAGE MEDIUM

(71) Applicants: Digital Grid Research Institute, China So Po Grid, Guangzhou (CN); Electric Pwr Rrch Ins of Guangxi Pwr Grd Co., Ltd., Nanning (CN)

(72) Inventors: Peng Li, Guangzhou (CN); Bing Tian, Guangzhou (CN); Ke Zhou, Guangzhou (CN); Zhiming Wang, Guangzhou (CN); Bofeng Luo, Guangzhou (CN); Xu Yin, Guangzhou (CN); Jiaming Zhang, Guangzhou (CN); Zhong Liu, Guangzhou (CN); Xiaoming Wang, Guangzhou (CN); Hongdi Sun, Guangzhou (CN); Qiancheng Lv, Guangzhou (CN); Renze Chen, Guangzhou (CN); Licheng Li, Guangzhou (CN)

(73) Assignees: Digital Grid Research Institute, China So Po Grid, Guangzhou (CN); Electric Pwr Rrch Ins of Guangxi Pwr Grd Co., Ltd., Nanning (CN)

( * ) Notice: Subject to any disclaimer, the term of this patent is extended or adjusted under 35 U.S.C. 154(b) by 0 days.

(21) Appl. No.: 17/883,879

(22) Filed: Aug. 9, 2022

(65) Prior Publication Data

US 2023/0065005 A1  Mar. 2, 2023

(30) Foreign Application Priority Data

Jun. 11, 2021 (CN) .......................... 202110656386.1

(51) Int. Cl.
  *G01R 23/02* (2006.01)

(52) U.S. Cl.
  CPC .................................. *G01R 23/02* (2013.01)

(58) Field of Classification Search
  CPC ...... G01R 23/02; G01R 27/14; G01R 15/146; G01R 19/00; G01R 19/0084
  See application file for complete search history.

(56) References Cited

U.S. PATENT DOCUMENTS

| 2002/0083779 A1 | 7/2002 | Narita et al. |
| 2005/0217797 A1 | 10/2005 | Jafarian-Tehrani |

(Continued)

FOREIGN PATENT DOCUMENTS

| CN | 1260880 A | 7/2000 |
| CN | 1350168 A | 5/2002 |

(Continued)

OTHER PUBLICATIONS

NPL Article of Electronics tutorial: Series resonance in a Series RLC resonant circuit—https://www.electronics-tutorials.ws/accircuits/series-resonance.html; Oct. 2010 (Year: 2010).*

(Continued)

*Primary Examiner* — Akm Zakaria
(74) *Attorney, Agent, or Firm* — Seyfarth Shaw LLP

(57) ABSTRACT

A voltage measurement device includes a probe module movably arranged around an alternating-current transmission line, and a measurement unit. A metal electrode is arranged on a surface of the probe module facing toward the alternating-current transmission line, electrically coupled with the alternating-current transmission line to form a coupling capacitor, and then forms an electrical circuit with an inductor element, a resistor element, and a reference signal source in the measurement unit. A processor controls the reference signal source to input reference voltage signals at different frequencies to the electrical circuit, determines a resonant frequency of the electrical circuit according to (Continued)

currents of the electrical circuit under the reference voltage signals at different frequencies, and determines a voltage of the alternating-current transmission line according to a first current component amplitude and the resonant frequency of the electrical circuit. A voltage measurement method and a storage medium are also disclosed.

10 Claims, 6 Drawing Sheets

(56) References Cited

U.S. PATENT DOCUMENTS

| 2017/0187292 A1* | 6/2017 | Schaemann | G01R 23/02 |
| 2017/0315159 A1* | 11/2017 | Ichikawa | H02J 7/04 |
| 2019/0072633 A1* | 3/2019 | Steuer | G01R 35/007 |

FOREIGN PATENT DOCUMENTS

| CN | 1684224 A | 10/2005 |
| CN | 101387613 A | 3/2009 |
| CN | 201766580 U | 3/2011 |
| CN | 204903656 U | 12/2015 |
| CN | 105445629 A | 3/2016 |
| CN | 105548833 A | 5/2016 |
| CN | 205620457 U | 10/2016 |
| CN | 208207059 U | 12/2018 |
| CN | 109425845 A | 3/2019 |
| CN | 212872652 U | 4/2021 |
| EP | 1092386 A1 | 4/2001 |
| JP | 2016003997 A | 1/2016 |
| WO | 1998059251 A2 | 12/1998 |
| WO | 2001026538 A1 | 4/2001 |

OTHER PUBLICATIONS

Aihua Zhao and Wei Li, "Discussion on Voltage Measurement Method of High Voltage Series Resonance Test," Modern Business Trade Industry, Nov. 18, 2009, pp. 300-301, vol. 21, No. 18.
Chinese Notification of Grant/Search Report for CN Application No. 202110656386.1, dated Feb. 8, 2022, 5 pages.

* cited by examiner

VOLTAGE MEASUREMENT DEVICE, VOLTAGE MEASUREMENT METHOD, AND STORAGE MEDIUM

This application claims priority to Chinese Patent Application No. 202110656386.1, filed on Jun. 11, 2021 and entitled "VOLTAGE MEASUREMENT DEVICE, VOLTAGE MEASUREMENT METHOD, AND STORAGE MEDIUM", which is incorporated herein by reference in its entirety.

TECHNICAL FIELD

The present disclosure relates to the technical field of measurement for a power system, and in particular, to a voltage measurement device, a voltage measurement method, and a storage medium.

BACKGROUND

In order to ensure normal operation of a power system, a voltage and a current of a transmission line in the power system are generally required to be monitored to ensure stable operation or fault early warning of the power system. In a conventional art, the voltage of the transmission line is mostly monitored by using a voltage transformer, which specifically involves: removing an insulation layer at a reserved node of a line to be measured after powering off the line to be measured, and connecting a primary side of the voltage transformer to a conductor inside the insulation layer; and calculating a voltage of the line to be measured by measuring a voltage of a secondary side of the voltage transformer after powering on the line to be measured.

However, in an existing voltage measurement method, due to the need for wiring and unwiring and a large size of the voltage transformer, the voltage measurement is inefficient, and the insulation of the line to be measured may be damaged, which thus leads to low safety.

SUMMARY

Based on the above, there is a need to provide, with respect to the above technical problems, a voltage measurement device that is easy to mount and can improve detection efficiency and detection safety of voltages of transmission lines, and a voltage measurement method and a storage medium for the same.

In a first aspect, a voltage measurement device is provided, including a probe module and a measurement unit. The probe module is movably arranged around an outer insulating surface layer of an alternating-current transmission line, a metal electrode is arranged on a surface of the probe module facing toward the alternating-current transmission line, and the measurement unit includes an inductor element, a resistor element, a reference signal source, and a processor.

The processor is configured to control the reference signal source to input reference voltage signals at different frequencies to an electrical circuit, and determine a resonant frequency of the electrical circuit according to currents of the electrical circuit under the reference voltage signals at different frequencies. The electrical circuit includes a coupling capacitor, the inductor element, the resistor element, and the reference signal source, and the coupling capacitor is a capacitor formed by electrical coupling between the metal electrode and the alternating-current transmission line The processor is further configured to determine a voltage of the alternating-current transmission line according to a first current component amplitude and the resonant frequency of the electrical circuit. The first current component amplitude is an amplitude of a current component corresponding to a frequency of the alternating-current transmission line in the current of the electrical circuit.

In an embodiment, the processor is specifically configured to determine the voltage of the alternating-current transmission line according to the first current component amplitude, the resonant frequency, and a voltage calculation formula. The voltage calculation formula is a relation including $$\left[R + j2\pi L\left(f_s - \frac{f_{rset}^2}{f_s}\right)\right] \cdot I_s,$$

where $f_{rset}$ denotes the resonant frequency, $I_s$ denotes the first current component amplitude, $f_s$ denotes a power frequency, $L$ denotes an inductance value of the inductor element, and $R$ denotes a resistance value of the resistor element.

In an embodiment, the processor is specifically configured to control the reference signal source to output a plurality of reference voltage signals at different frequencies, and determine second current component amplitudes respectively corresponding to the reference voltage signals at the different frequencies. The second current component amplitudes are amplitudes of current components respectively corresponding to the frequencies of the reference voltage signals in the currents of the electrical circuit.

The processor is configured to determine the resonant frequency of the electrical circuit according to the second current component amplitudes and a preset search algorithm.

In an embodiment, the processor is specifically configured to determine a plurality of frequency values in a reference frequency range according to a reference step size, and control the reference signal source to output reference voltage signals corresponding to the plurality of frequency values to obtain a current amplitude sequence. The current amplitude sequence includes second current component amplitudes respectively corresponding to the reference voltage signals.

The processor is configured to determine whether a difference between a first frequency value corresponding to a subsequent current amplitude of a maximum current amplitude in the current amplitude sequence and a second frequency value corresponding to a previous current amplitude of the maximum current amplitude is less than a preset threshold.

The processor is configured to determine that any one of the first frequency value, the second frequency value, and the frequency value corresponding to the maximum current amplitude is the resonant frequency if the difference is less than the preset threshold.

In an embodiment, the processor is further configured to take, if the difference is greater than or equal to the preset threshold, the second frequency value and the first frequency value as a new reference frequency range, and perform iterative processing until the difference between the first frequency value and the second frequency value is less than the preset threshold.

The iterative processing includes: determining a plurality of frequency values in the new reference frequency range according to a new reference step size, and controlling the reference signal source to output reference voltage signals corresponding to the plurality of frequency values to obtain a current amplitude sequence; and determining whether a difference between a first frequency value corresponding to a subsequent current amplitude of a maximum current amplitude in the current amplitude sequence and a second frequency value corresponding to a previous current amplitude of the maximum current amplitude is less than the preset threshold.

In an embodiment, the measurement unit further includes a signal processing module connected in series in the electrical circuit, and further connected to the processor.

The signal processing module is configured to detect a current signal in the electrical circuit, perform signal separation processing on the current signal, determine the first current component amplitude and the second current component amplitudes, and send the first current component amplitude and the second current component amplitudes to the processor.

In an embodiment, the probe module includes a first probe connected to a live line of the alternating-current transmission line, and a second probe connected to a null line or earth line of the alternating-current transmission line.

The metal electrode of the first probe is electrically coupled with the live line to form a first coupling capacitor; the metal electrode of the second probe is electrically coupled with the null line or earth line to form a second coupling capacitor.

In an embodiment, the voltage measurement device further includes a shielding enclosure enclosing the probe module and the measurement unit.

In an embodiment, the measurement unit further includes a human-computer module connected to the processor and configured to output probe position information used to indicate a sub-circuit which the probe module is currently arranged around. The sub-circuit includes any two of the live line, the null line, and the earth line of the alternating-current transmission line.

The human-computer module is further configured to receive confirmation information entered by a user, and the confirmation information is confirmation information of the probe position information.

The processor is further configured to receive the confirmation information sent by the human-computer module, and in response to the confirmation information, control the reference signal source to input reference voltage signals at different frequencies to the electrical circuit to determine the voltage of the alternating-current transmission line.

In an embodiment, the human-computer module is further configured to acquire a reference frequency range entered by the user.

The human-computer module is further configured to output the voltage of the alternating-current transmission line.

In a second aspect, a voltage measurement method applied to a voltage measurement device is provided. The voltage measurement device includes a probe module and a measurement unit. The probe module is movably arranged around an outer insulating surface layer of an alternating-current transmission line, a metal electrode is arranged on a surface of the probe module facing toward the alternating-current transmission line, and the measurement unit includes an inductor element, a resistor element, and a reference signal source. The method includes:

controlling the reference signal source to input reference voltage signals at different frequencies to an electrical circuit, and determining a resonant frequency of the electrical circuit according to currents of the electrical circuit under the reference voltage signals at different frequencies, the electrical circuit including a coupling capacitor, the inductor element, the resistor element, and the reference signal source, the coupling capacitor being a capacitor formed by electrical coupling between the metal electrode and the alternating-current transmission line; and determining a voltage of the alternating-current transmission line according to a first current component amplitude and the resonant frequency of the electrical circuit, the first current component amplitude being an amplitude of a current component corresponding to a frequency of the alternating-current transmission line in the current of the electrical circuit.

In an embodiment, the determining the voltage of the alternating-current of the electrical circuit includes: determining the voltage of the alternating-current transmission line according to the first current component amplitude, the resonant frequency, and a voltage calculation formula. The voltage calculation formula is a relation including $$\left[R + j2\pi L\left(f_s - \frac{f_{rset}^2}{f_s}\right)\right] \cdot I_s,$$

where $f_{rset}$ denotes the resonant frequency, $I_s$ denotes the first current component amplitude, $f_s$ denotes a power frequency, L denotes an inductance value of the inductor element, and R denotes a resistance value of the resistor element.

In an embodiment, the controlling the reference signal source to input the reference voltage signals at different frequencies to the electrical circuit, and determining the resonant frequency of the electrical circuit according to the currents of the electrical circuit under the reference voltage signals at different frequencies includes: controlling the reference signal source to output a plurality of reference voltage signals at different frequencies, and determining second current component amplitudes respectively corresponding to the reference voltage signals at the different frequencies, the second current component amplitudes being amplitudes of current components respectively corresponding to the frequencies of the reference voltage signals in the currents of the electrical circuit; and determining the resonant frequency of the electrical circuit according to the second current component amplitudes and a preset search algorithm.

In an embodiment, the controlling the reference signal source to input the reference voltage signals at different frequencies to the electrical circuit, and determining the resonant frequency of the electrical circuit according to the currents of the electrical circuit under the reference voltage signals at different frequencies includes: determining a plurality of frequency values in a reference frequency range according to a reference step size, and controlling the reference signal source to output reference voltage signals corresponding to the plurality of frequency values to obtain a current amplitude sequence, the current amplitude sequence including second current component amplitudes respectively corresponding to the reference voltage signals; determining whether a difference between a first frequency value corresponding to a subsequent current amplitude of a maximum current amplitude in the current amplitude sequence and a second frequency value corresponding to a previous current amplitude of the maximum current amplitude is less than a preset threshold; and determining that any one of the first frequency value, the second frequency value, and the frequency value corresponding to the maximum current amplitude is the resonant frequency if the difference is less than the preset threshold.

In an embodiment, the method further includes: taking, if the difference is greater than or equal to the preset threshold, the second frequency value and the first frequency value as a new reference frequency range, and performing iterative processing until the difference between the first frequency value and the second frequency value is less than the preset threshold. The iterative processing includes: determining a plurality of frequency values in the new reference frequency range according to a new reference step size, and controlling the reference signal source to output reference voltage signals corresponding to the plurality of frequency values to obtain a current amplitude sequence; and determining whether a difference between a first frequency value corresponding to a subsequent current amplitude of a maximum current amplitude in the current amplitude sequence and a second frequency value corresponding to a previous current amplitude of the maximum current amplitude is less than the preset threshold.

In an embodiment, the method further includes: sending probe position information to a human-computer module to cause the human-computer module to output the probe position information used to indicate a sub-circuit which the probe module is currently arranged around, the sub-circuit including any two of the live line, the null line, and the earth line of the alternating-current transmission line; receiving confirmation information sent by the human-computer module; and in response to the confirmation information, controlling the reference signal source to input reference voltage signals at different frequencies to the electrical circuit to determine the voltage of the alternating-current transmission line.

In an embodiment, the method further includes: receiving a reference frequency range entered by the user sent by the human-computer module, and controlling the reference signal source to input reference voltage signals at different frequencies to the electrical circuit according to the reference frequency range to determine a voltage of the alternating-current transmission line; and sending the voltage of the alternating-current transmission line to the human-computer module to enable the human-computer module to output the voltage of the alternating-current transmission line.

In a third aspect, a voltage measurement device is provided, the device including:

a control module configured to control a reference signal source to input reference voltage signals at different frequencies to an electrical circuit;

a first determination module configured to determine a resonant frequency of the electrical circuit according to currents of the electrical circuit under the reference voltage signals at different frequencies, the electrical circuit including a coupling capacitor, an inductor element, a resistor element, and the reference signal source, the coupling capacitor being a capacitor formed by electrical coupling between a metal electrode and an alternating-current transmission line; and a second determination module configured to determine a voltage of the alternating-current transmission line according to a first current component amplitude and the resonant frequency of the electrical circuit, the first current component amplitude being an amplitude of a current component corresponding to a frequency of the alternating-current transmission line in the current of the electrical circuit.

In a fourth aspect, a voltage measurement device is provided, including a memory and a processor, the memory storing a computer program, the processor, when executing the computer program, performing any step performed by the processor in the first aspect.

In a fifth aspect, a computer-readable storage medium is provided, storing a computer program, the computer program, when executed by a processor, causing the processor to perform any step performed by the processor in the first aspect.

According to the voltage measurement device, the voltage measurement method, and the storage medium, the voltage measurement device includes a probe module and a measurement unit. The probe module is movably arranged around an outer insulating surface layer of an alternating-current transmission line, a metal electrode is arranged on a surface of the probe module facing toward the alternating-current transmission line, and the measurement unit includes an inductor element, a resistor element, a reference signal source, and a processor. After the probe module is arranged around the alternating-current transmission line, the metal electrode is electrically coupled with the alternating-current transmission line to form a coupling capacitor, and then forms an electrical circuit with the inductor element, the resistor element, and the reference signal source in the measurement unit. The processor controls the reference signal source to input reference voltage signals at different frequencies to the electrical circuit, and determines a resonant frequency of the electrical circuit according to currents of the electrical circuit under the reference voltage signals at different frequencies; and next, the processor determines a voltage of the alternating-current transmission line according to a first current component amplitude and the resonant frequency of the electrical circuit. The first current component amplitude is an amplitude of a current component corresponding to a frequency of the alternating-current transmission line in the current of the electrical circuit. In other words, in the embodiments of the present disclosure, when the voltage of the alternating-current transmission line is measured, it only needs the probe module to be arranged around the outer insulating surface layer of the alternating-current transmission line, without removing the insulation layer of the alternating-current transmission line, and then connecting the probe module to a conductor inside the insulation layer. That is, in these embodiments, the probe module can realize non-contact measurement on the voltage of the alternating-current transmission line without being in metal contact with the alternating-current transmission line or de-energizing the alternating-current transmission line, which thus prevents wiring and unwiring of contact measurement in the prior art, is simple in mounting, and greatly improves the efficiency of voltage measurement. Meanwhile, in this embodiment, the voltage measurement device is not required to damage the insulation layer of the transmission line, which can prevent damages to the insulation layer of the alternating-current transmission line and improve the safety of the transmission line. In addition, according to the voltage measurement device in these embodiments, after the probe module is arranged around the outer insulating surface layer of the alternating-current transmission line, the reference signal source can be controlled to input reference voltage signals at different frequencies, and the voltage of the alternating-current transmission line is determined according to a resonant frequency determined according to a current in the electrical circuit and a first current component amplitude in the current corresponding to the frequency of the alternating-current transmission line. In this manner, the voltage of the alternating-current transmission line can be accurately calculated, and accuracy of measurement on the voltage of the alternating-current transmission line can be improved.

REFERENCE NUMERALS

Figure 1:
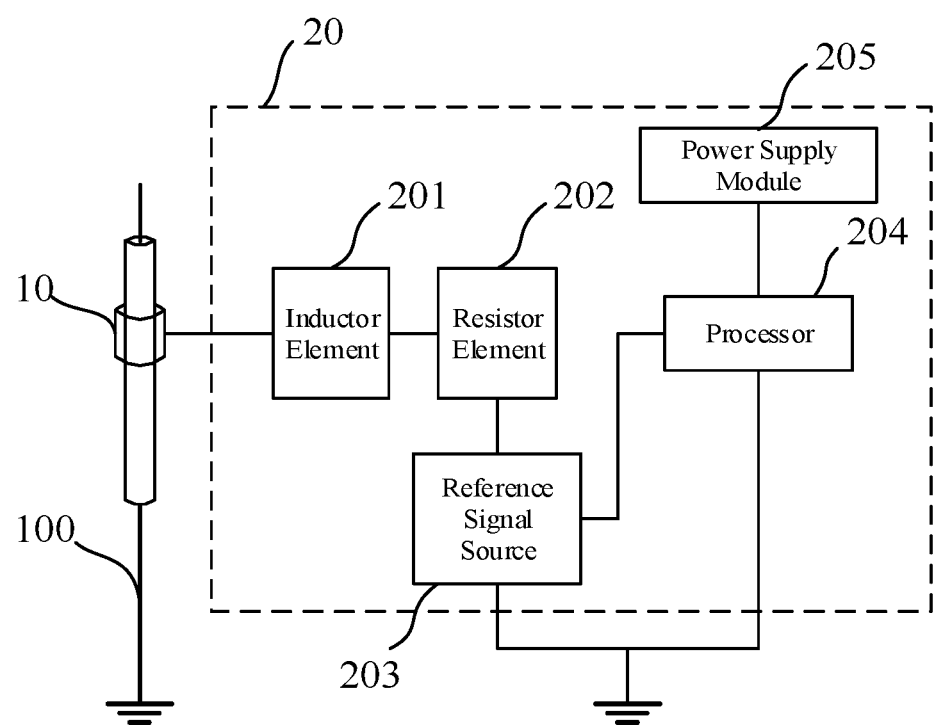
FIG. 1 is a schematic diagram illustrating a configuration of a voltage measurement device according to an embodiment.

100: alternating-current transmission line;
10: probe module;
20: measurement unit;
201: inductor element;
202: resistor element;
203: reference signal source;
204: processor;
205: power supply module;
206: signal processing module;
101: first probe;
102: second probe;
1001: live line of the alternating-current transmission line;
1002: null line or earth line of the alternating-current transmission line; and
207: human-computer module.

DETAILED DESCRIPTION OF THE EMBODIMENTS

In order to make the objectives, technical solutions, and advantages of the present disclosure clearer, the present disclosure is described in further detail below with reference to the accompanying drawings and embodiments. It should be understood that specific embodiments described herein are intended only to interpret the present disclosure and not to limit the present disclosure.

A voltage measurement device according to the present disclosure is applied to the technical field of measurement for a power system and configured to detect a voltage of the power system. The voltage measurement device in this embodiment can realize non-contact voltage measurement, and improve efficiency and safety of voltage detection and accuracy of voltage detection.

In the prior art, the voltage of the transmission line in the power system is generally measured with a contact voltage measurement method. That is, on the premise of powering off of the transmission line, a probe of a voltage transformer is connected to a metal conductor inside the transmission line, complicated wiring and unwiring are required, and contact between the probe and the metal conductor is required to be detected in real time. The quality of a contact surface directly affects reliability and accuracy of a detection result, resulting in low efficiency of voltage measurement. Meanwhile, due to a large size and a high price of the voltage transformer and a risk of explosion in the event of short circuit, the voltage transformer is further required to be placed on a support column with a certain height during the mounting, which has high human and financial costs and low safety. Moreover, the voltage transformer can only detect a low-frequency alternating-current signal of the transmission line, which has a limited detection range. In addition, the contact voltage measurement method in the prior art involves setting a voltage measurement node at the beginning of erection of the transmission line. An insulating surface layer at the voltage measurement node is easy to be removed, so that the voltage transformer can be easily connected at the preset voltage measurement node in the later stage for voltage measurement. Therefore, the contact voltage measurement method in the prior art is easily limited by the voltage measurement node during the detection on the voltage of the transmission line. In actual voltage measurement, it is often impossible to remove the insulation layer or inconvenient to damage the insulation layer in more complex environments, resulting in poor flexibility of voltage measurement. Besides, the damages to the insulation surface of the transmission line in the prior art easily cause damages to insulation of the transmission line, and are prone to formation of sparks, resulting in unsafe accidents, that is, low safety.

Therefore, the voltage measurement device according to the embodiments of the present disclosure can be movably arranged around the outer insulating surface layer of the alternating-current transmission line without damaging the insulating surface layer of the transmission line. In other words, the voltage measurement device in this embodiment can flexibly detect the voltage at any position of the alternating-current transmission line, which can solve the problems of low detection efficiency, low safety, high costs, and poor flexibility of the voltage transformer in the prior art. By use of the voltage measurement device in this embodiment, the voltage of the alternating-current transmission line can be detected through electrical coupling between the probe and the alternating-current transmission line when the probe is arranged around the alternating-current transmission line, which improves efficiency of voltage detection.

The technical solutions of the present disclosure and how the above technical problems are solved by the technical solutions of the present disclosure are described in detail below with specific embodiments. The following several specific embodiments may be combined with each other, and identical or similar concepts or processes may not be repeated in some embodiments. The embodiments of the present disclosure are described below with reference to the accompanying drawings.

FIG. 1 is a schematic diagram illustrating a configuration of a voltage measurement device according to an embodiment. As shown in FIG. 1, the voltage measurement device includes a probe module 10 and a measurement unit 20. The probe module 10 is movably arranged around an outer insulating surface layer of an alternating-current transmission line 100. A metal electrode is arranged on a surface of the probe module 10 facing toward the alternating-current transmission line 100. The measurement unit 20 includes an inductor element 201, a resistor element 202, a reference signal source 203, and a processor 204. The processor 204 is configured to control the reference signal source 203 to input reference voltage signals at different frequencies to an electrical circuit, and determine a resonant frequency of the electrical circuit according to currents of the electrical circuit under the reference voltage signals at different frequencies. The electrical circuit includes a coupling capacitor, the inductor element 201, the resistor element 202, and the reference signal source 203. The coupling capacitor is a capacitor formed by electrical coupling between the metal electrode and the alternating-current transmission line 100. The processor 204 is further configured to determine a voltage of the alternating-current transmission line 100 according to a first current component amplitude and the resonant frequency of the electrical circuit. The first current component amplitude is an amplitude of a current component corresponding to a frequency of the alternating-current transmission line in the current of the electrical circuit.

Optionally, the probe module 10 may be of a cylindrical structure formed by two nested rings. An inner side of the cylindrical probe (that is, the surface facing toward the alternating-current transmission line) is provided with a conducting electrode plate, i.e., a metal electrode. The metal electrode is connected to the measurement unit 20. An outer side of the cylindrical probe may be made from an insulating material. For a manner in which the probe module 10 is arranged around the outer insulating surface layer of the alternating-current transmission line 100, optionally, the probe module 10 may be of a clamp structure to clamp the probe module 10 on the outer insulating surface layer of the alternating-current transmission line 100, or of another structure such as a buckle structure. It is to be noted that the manner in which the probe module is arranged around the outer insulating surface layer of the alternating-current transmission line is not limited in this embodiment.

Optionally, the inductor element 201 in the measurement unit 20 may include one or more inductors. The resistor element 202 in the measurement unit 20 may include one or more resistors. Forms and structures of the inductor element 201 and the resistor element 202 are not limited in this embodiment. The reference signal source 203 may be a frequency-adjustable voltage signal source. The processor 204, when controlling the reference signal source 203 to output reference voltage signals at different frequencies, may use a PWM technology or an SPWM technology to control the frequencies of the reference voltage signals output by the reference signal source 203. Any manner in the prior art may be used herein, and the manner of controlling the reference signal source 203 is not limited in this embodiment. The processor 204 may be a microprocessor, an embedded processor, a dedicated digital signal processor, or the like. The type of the processor 204 is not limited in this embodiment. The measurement unit 20 in this embodiment further includes a power supply module 205. The power supply module 205 provides an operating voltage for the processor 204. The power supply module 205 may be a lithium battery or other hardware elements that can provide power.

Figure 2:
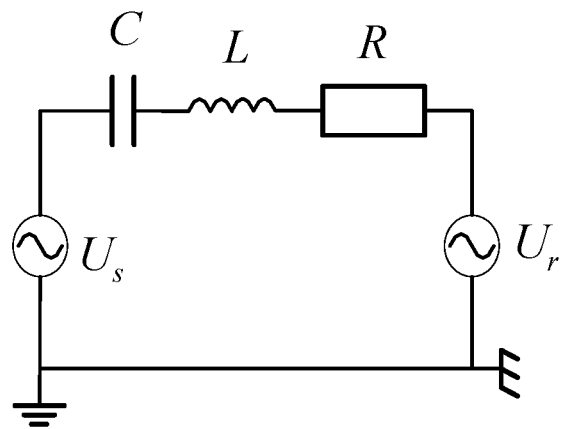
FIG. 2 is a schematic diagram illustrating a configuration of an electrical circuit according to an embodiment.

Optionally, the voltage of the alternating-current transmission line in this embodiment may be equivalent to a voltage source, and then an equivalent structural diagram of the electrical circuit may be shown in FIG. 2, where $U_s$ denotes the voltage of the alternating-current transmission line, a frequency of an alternating-current voltage signal output by the alternating-current transmission line is a power frequency, i.e., 50 Hz, C denotes a coupling capacitance between the metal electrode of the probe module and the alternating-current transmission line, L denotes an equivalent inductance of the inductor element, R denotes an equivalent resistance of the resistor element, and $U_r$ denotes the reference signal source. Frequencies of the reference voltage signals output by the reference signal source may be the same as or different from the power frequency.

Since two signal sources in the electrical circuit output alternating-current voltage signals externally, the current in the electrical circuit also includes a first current component under the action of the alternating-current voltage signal at the power frequency and second current components under the action of the reference voltage signals. That is, the current in the electrical circuit is formed by superposition of the first current component and the second current components. The resonant frequency of the electrical circuit is determined by adjusting the frequencies of the reference voltage signals output by the reference signal source. Under the action of the resonant frequency, the inductance and the capacitance in the electrical circuit can be equivalent to a short circuit, enabling a total resistance value in the electrical circuit to be minimized, so the current in the electrical circuit may be maximized. In other words, the processor may determine the resonant frequency of the electrical circuit according to currents of the electrical circuit under the action of the reference voltage signals at different frequencies. The currents in the electrical circuit can be analyzed to obtain a corresponding frequency when the current is maximized, that is, the resonant frequency of the electrical circuit.

In addition, the processor may further obtain a first current component consistent with a voltage frequency of the alternating-current transmission line by analyzing the current in the electrical circuit, and then may obtain an amplitude of the first current component to obtain a first current component amplitude. Optionally, the processor may control the output of the reference signal source to be 0, and then only the alternating-current transmission line in the electrical circuit outputs a voltage externally. That is, in this case, the current in the electrical circuit is the first current component consistent with the voltage frequency of the alternating-current transmission line, and the first current component amplitude may be obtained according to the first current component. Next, the processor may determine the voltage of the alternating-current transmission line according to the first current component amplitude and the resonant frequency. Optionally, the processor may determine the voltage of the alternating-current transmission line according to a preset algorithm, the first current component amplitude, and the resonant frequency.

The above voltage measurement device includes a probe module and a measurement unit. The probe module is movably arranged around an outer insulating surface layer of an alternating-current transmission line, a metal electrode is arranged on a surface of the probe module facing toward the alternating-current transmission line, and the measurement unit includes an inductor element, a resistor element, a reference signal source, and a processor. After the probe module is arranged around the alternating-current transmission line, the metal electrode is electrically coupled with the alternating-current transmission line to form a coupling capacitor, and then forms an electrical circuit with the inductor element, the resistor element, and the reference signal source in the measurement unit. The processor controls the reference signal source to input reference voltage signals at different frequencies to the electrical circuit, and determines a resonant frequency of the electrical circuit according to currents of the electrical circuit under the reference voltage signals at different frequencies; and next, the processor determines a voltage of the alternating-current transmission line according to a first current component amplitude and the resonant frequency of the electrical circuit. The first current component amplitude is an amplitude of a current component corresponding to a frequency of the alternating-current transmission line in the current of the electrical circuit. In other words, in the embodiments of the present disclosure, when the voltage of the alternating-current transmission line is measured, it only needs the probe module to be arranged around the outer insulating surface layer of the alternating-current transmission line, without removing the insulation layer of the alternating-current transmission line, and then connecting the probe module to a conductor inside the insulation layer. That is, in these embodiments, the probe module can realize non-contact measurement on the voltage of the alternating-current transmission line without being in metal contact with the alternating-current transmission line or de-energizing the alternating-current transmission line, which thus prevents wiring and unwiring of contact measurement in the prior art, is simple in mounting, and greatly improves the efficiency of voltage measurement. Meanwhile, in this embodiment, the voltage measurement device is not required to damage the insulation layer of the transmission line, which can prevent damages to the insulation layer of the alternating-current transmission line and improve the safety of the transmission line. In addition, according to the voltage measurement device in these embodiments, after the probe module is arranged around the outer insulating surface layer of the alternating-current transmission line, the reference signal source can be controlled to output reference voltage signals at different frequencies, and the voltage of the alternating-current transmission line is determined according to a resonant frequency determined according to a current in the electrical circuit and a first current component amplitude in the current corresponding to the frequency of the alternating-current transmission line. In this manner, the voltage of the alternating-current transmission line can be accurately calculated, and accuracy of measurement on the voltage of the alternating-current transmission line can be improved.

In an optional embodiment of the present disclosure, the processor is specifically configured to determine the voltage of the alternating-current transmission line according to the first current component amplitude, the resonant frequency, and a voltage calculation formula. The voltage calculation formula is a relation including $$\left[R + j2\pi L\left(f_s - \frac{f_{rset}^2}{f_s}\right)\right] \cdot I_s,$$

where $f_{reset}$ denotes the resonant frequency, $I_s$ denotes the first current component amplitude, $f_s$ denotes a power frequency, L denotes an inductance value of the inductor element, and R denotes a resistance value of the resistor element.

Figure 3:
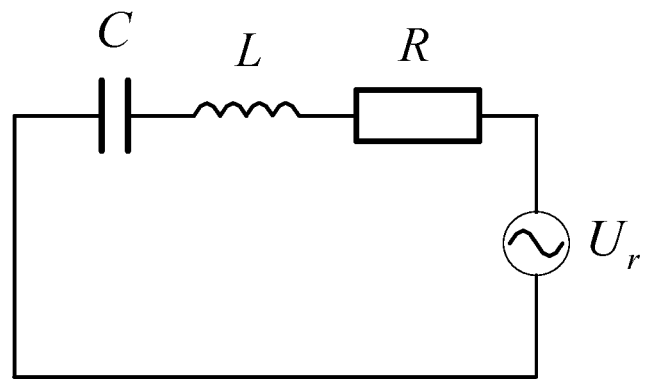
FIG. 3 is an equivalent circuit diagram when a reference signal source acts alone according to an embodiment.
Figure 4:
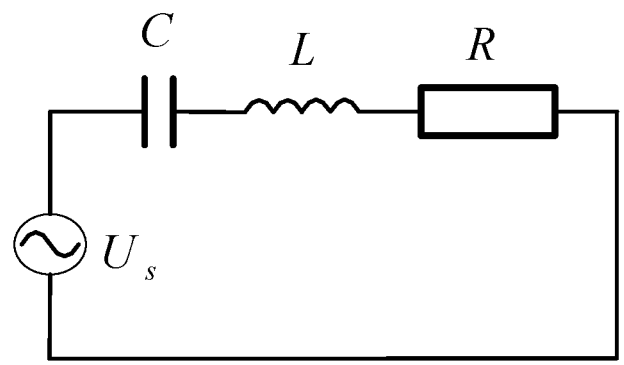
FIG. 4 is an equivalent circuit diagram when an alternating-current transmission line acts alone according to an embodiment.

Referring to FIG. 2, according to a principle of circuit superposition, FIG. 2 may be equivalent to an equivalent circuit diagram in FIG. 3 when the reference signal source acts alone and an equivalent circuit diagram in FIG. 4 when the alternating-current transmission line acts alone.

FIG. 3 is an equivalent circuit diagram when a reference signal source acts alone, as shown in FIG. 3. Under the action of a reference voltage signal (at a frequency of $f_r$), impedances of the capacitance C of the coupling capacitor, the inductance L of the equivalent inductor, and the resistance R of the equivalent resistor may be respectively expressed as:

$$Z_{rc} = \frac{1}{j\omega_r C} \quad (1)$$

$$Z_{rl} = j\omega_r L \quad (2)$$

$$Z_{rr} = R \quad (3)$$

where $\omega_r = 2\pi f_r$, and $f_r$ denotes the frequency of the reference voltage signal.

According to Ohm's law of circuits, the current $I_r$ in the electrical circuit may be expressed as:

$$I_r = \frac{U_r}{R + j\omega_r L + \frac{1}{j\omega_r C}} \quad (4)$$

Then, a total impedance in the electrical circuit may be expressed as:

$$Z = \frac{U_r}{I_r} = R + j(X_L - X_C) \quad (5)$$

The impedance $X_L$ of the equivalent inductor and the impedance $X_C$ of the coupling capacitor may be expressed as:

$$X_L = \omega_r L \quad (6)$$

$$X_C = \frac{1}{\omega_r C} \quad (7)$$

In a case where the impedance $X_L$ of the equivalent inductor and the impedance $X_C$ of the coupling capacitor are equal, $\omega_r$ satisfies:

$$\omega_r = \frac{1}{\sqrt{LC}} \quad (8)$$

In other words, the impedance $X_L$ of the equivalent inductor and the impedance $X_C$ of the coupling capacitor can be equal by adjusting the frequency $f_r$ of the reference voltage signal, so that the coupling capacitor and the equivalent inductor in the electrical circuit reach a state of series resonance. In a resonance state, the total impedance in the electrical circuit includes only the impedance of the resistance R of the equivalent resistor. That is, in the resonance state, the total impedance in the electrical circuit is minimized. In this case, the voltage $U_r$ and the current $I_r$ in the electrical circuit are in-phase, and an amplitude of the current $I_r$ in the electrical circuit is maximized. In this case, the frequency of the reference voltage signal is expressed as $f_{r0}$, so $f_{r0}$ satisfies:

$$f_{r0} = \frac{1}{2\pi\sqrt{LC}} \quad (9)$$

The processor controls the reference signal source to input reference voltage signals at different frequencies to the electrical circuit, and can determine a resonant frequency $f_{rset}$ of the electrical circuit according to currents of the electrical circuit under the reference voltage signals at different frequencies. The resonant frequency $f_{rset}$ is $f_{r0}$ theoretically derived above, that is, $f_{rset}=f_{r0}$.

The capacitance C of the coupling capacitor may be determined according to the resonant frequency $f_{rset}$, that is, $$C = \frac{1}{4\pi^2 L f_{rset}^2} \quad (10)$$

FIG. 4 is an equivalent circuit diagram when an alternating-current transmission line acts alone, as shown in FIG. 4. Under the action of the alternating-current transmission line (at a power frequency $f_s$), impedances of the capacitance C, of the coupling capacitor, the inductance L of the equivalent inductor, and the resistance R of the equivalent resistor may be respectively expressed as:

$$Z_{sc} = \frac{1}{j\omega_s C} \quad (11)$$

$$Z_{sl} = j\omega_s L \quad (12)$$

$$Z_{sr} = R \quad (13)$$

where $\omega_s=2\pi f_s$, and $f_s$ denotes the power frequency, which is also known as power line frequency, utility frequency and mains frequency, and means a voltage frequency of the alternating-current transmission line.

According to Ohm's law of circuits, the current $I_s$ in the electrical circuit may be expressed as:

$$I_s = \frac{U_s}{R + j\omega_s L + \frac{1}{j\omega_s C}} \quad (14)$$

Then, the voltage $U_s$ of the alternating-current transmission line may be expressed as:

$$U_s = \left[R + j2\pi L\left(f_s - \frac{f_{rset}^2}{f_s}\right)\right] \cdot I_s \quad (15)$$

The formula (15) is taken as the voltage calculation formula of the alternating-current transmission line. The processor can obtain the resonant frequency $f_{rset}$ of the electrical circuit through the above process of determining the resonant frequency. Further, the processor may obtain a first current component amplitude $I_s$ in the current of the electrical circuit corresponding to the voltage frequency of the alternating-current transmission line by analyzing the currents in the electrical circuit, and then calculate the voltage of the alternating-current transmission line through the above voltage calculation formula according to the first current component amplitude $I_s$, the resonant frequency $f_{rset}$, and known resistance value R and inductance value L.

In this embodiment, the processor determines the voltage of the alternating-current transmission line according to the first current component amplitude, the resonant frequency, and the voltage calculation formula. In other words, the processor can obtain the voltage of the alternating-current transmission line only by obtaining the first current component amplitude and the resonant frequency of the electrical circuit under the sole action of the alternating-current transmission line and then substituting the first current component amplitude and the resonant frequency into the voltage calculation formula. The voltage calculation method in this embodiment is simple and can greatly improve efficiency of detection on the voltage of the alternating-current transmission line.

In an optional embodiment of the present disclosure, when controlling the reference signal source to input reference voltage signals at different frequencies to an electrical circuit, and determining a resonant frequency of the electrical circuit according to currents of the electrical circuit under the reference voltage signals at different frequencies, optionally, the processor may control the reference signal source to output a plurality of reference voltage signals at different frequencies, and determine second current component amplitudes respectively corresponding to the reference voltage signals at the different frequencies. The second current component amplitudes are current amplitudes of the electrical circuit under the sole action of the reference signal source; and determine the resonant frequency of the electrical circuit according to the second current component amplitudes and a preset search algorithm.

The current in the electrical circuit acquired by the processor is formed by superposition of the first current component under the action of the alternating-current voltage signal at the power frequency and the second current components under the action of the reference voltage signals. Therefore, the processor can filter out a current component consistent with the frequency of the reference voltage signal from an acquired current signal of the electrical circuit, the current component being a second current component corresponding to the reference voltage signal, and then can analyze the second current component to obtain the second current component amplitude. That is, the processor can obtain second current component amplitudes respectively corresponding to a plurality of reference voltage signals at different frequencies. Optionally, the processor can determine a plurality of frequency values in a preset frequency range according to a reference step size, and control the reference signal source to sequentially output a reference voltage signal corresponding to each frequency value to obtain a second current component amplitude corresponding to the reference voltage signal of each frequency value. The plurality of second current component amplitudes first increase and then decrease as the frequency increases. Next, the processor may determine the resonant frequency of the electrical circuit according to the second current component amplitudes and a preset search algorithm. Optionally, the processor may select a maximum current component amplitude from the plurality of second current component amplitudes and take a frequency corresponding to the maximum current component amplitude as the resonant frequency of the electrical circuit.

In this embodiment, the processor controls the reference signal source to output a plurality of reference voltage signals at different frequencies, determines second current component amplitudes respectively corresponding to the reference voltage signals at the different frequencies, and determines the resonant frequency of the electrical circuit according to the second current component amplitudes and a preset search algorithm. In other words, the processor controls the reference signal source to sequentially output a plurality of reference voltage signals at different frequencies, and according to a second current component amplitude under the action of each reference voltage signal, determines a frequency corresponding to a maximum current component amplitude as the resonant frequency of the electrical circuit. The algorithm is simple and easy to implement, and can improve the efficiency of development of the processor.

In an optional embodiment of the present disclosure, when controlling the reference signal source to input reference voltage signals at different frequencies to an electrical circuit, and determining a resonant frequency of the electrical circuit according to currents of the electrical circuit under the reference voltage signals at different frequencies, the processor may further determine a plurality of frequency values in a reference frequency range according to a reference step size, and control the reference signal source to output reference voltage signals corresponding to the plurality of frequency values to obtain a current amplitude sequence. The current amplitude sequence includes second current component amplitudes respectively corresponding to the reference voltage signals. Next, the processor may determine whether a difference between a first frequency value corresponding to a subsequent current amplitude of a maximum current amplitude in the current amplitude sequence and a second frequency value corresponding to a previous current amplitude of the maximum current amplitude is less than a preset threshold, and determine that any one of the first frequency value, the second frequency value, and the frequency value corresponding to the maximum current amplitude is the resonant frequency if the difference is less than the preset threshold. Optionally, if the difference is greater than or equal to the preset threshold, the second frequency value and the first frequency value are taken as a new reference frequency range, and iterative processing is performed until the difference between the first frequency value and the second frequency value is less than the preset threshold. The iterative processing includes: determining a plurality of frequency values in the new reference frequency range according to a new reference step size, and controlling the reference signal source to output reference voltage signals corresponding to the plurality of frequency values to obtain a current amplitude sequence; and determining whether a difference between a first frequency value corresponding to a subsequent current amplitude of a maximum current amplitude in the current amplitude sequence and a second frequency value corresponding to a previous current amplitude of the maximum current amplitude is less than the preset threshold.

Specifically, the processor may preset the reference frequency range or receive a reference frequency range entered by a user. The reference frequency range includes a start frequency $f_{rstar}$ and an end frequency $f_{rend}$. In addition, the processor may preset the reference step size. The reference step size may decrease as the number of searches increases. For example, the reference step size may be set to 10 for the first search, 1 for the second search, 0.1 for the third search, and so on. The processor may also preset the number of searches, and calculate the reference step size according to the number of searches and the reference frequency range. For example, the processor may preset the number of searches to n+1, and then the reference step size $\Delta f$ may be expressed as:

$$\Delta f = \frac{f_{rend} - f_{rstar}}{n} \tag{16}$$

It is to be noted that, when the processor performs multiple searches, the number of searches may be different or identical for each search, which is not limited in this embodiment.

Figure 5:
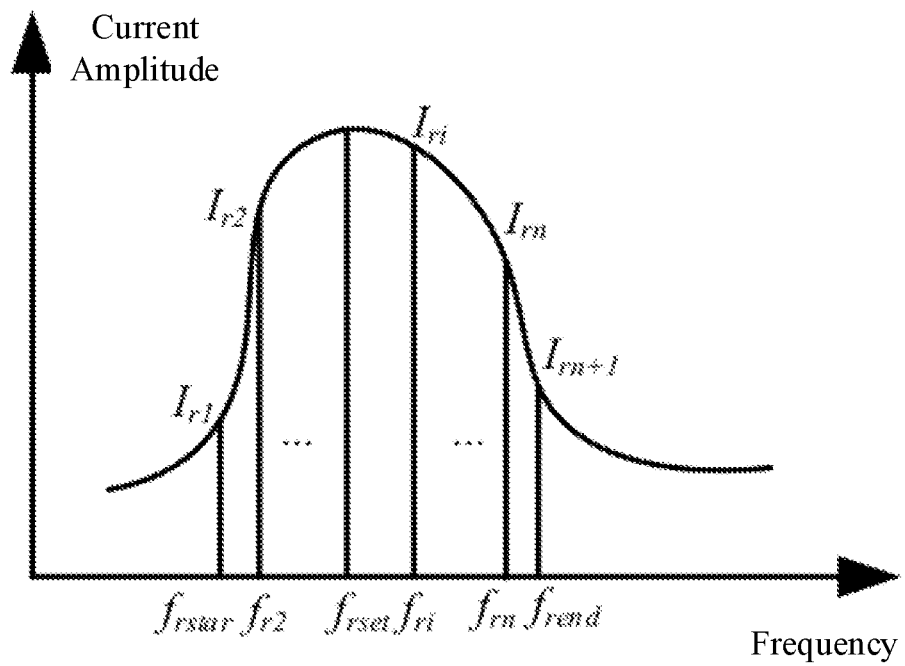
FIG. 5 is a schematic diagram illustrating variations of a current amplitude sequence according to an embodiment.

After obtaining the reference frequency range and the reference step size, the processor may determine a plurality of frequency values in the reference frequency range according to the reference step size, and control the reference signal source to output reference voltage signals corresponding to the plurality of frequency values to obtain second current component amplitudes respectively corresponding to the reference voltage signals, that is, a current amplitude sequence, which may be expressed as $[I_{r1}, I_{r2}, \ldots, I_{ri}, \ldots, I_{rm}, I_{m+1}]$. Variations of the current amplitude sequence may be shown in FIG. 5, that is, first increase and then decrease.

Previous current amplitudes are sequentially subtracted from subsequent current amplitudes in the current amplitude sequence, and then a current amplitude satisfies the following requirement:

$$\begin{cases} I_{r2} - I_{r1} > 0 \\ I_{r3} - I_{r2} > 0 \\ \ldots \\ I_{rm+1} - I_{rm} > 0 \\ I_{rm+2} - I_{rm+1} < 0 \\ \ldots \\ I_{rn+1} - I_{rn} < 0 \end{cases} \tag{17}$$

It may be determined according to the formula (17) that $I_{rm+1}$ is the maximum current amplitude in the current amplitude sequence.

Next, it is determined whether a difference between a first frequency value $f_{rm+2}$ corresponding to a subsequent current amplitude $I_{rm+2}$ of the maximum current amplitude and a second frequency value $f_{rm}$ corresponding to a previous current amplitude $I_{rm}$ of the maximum current amplitude is less than a preset threshold, that is, whether $f_{rm+2} - f_{rm} < T$ is established. If $f_{rm+2} - f_{rm} < T$ is established, that is, the difference between the first frequency value $f_{rm+2}$ and the second frequency value $f_{rm}$ is less than the preset threshold, it may be determined that a frequency value corresponding to the maximum current amplitude is close to the resonant frequency theoretically calculated. Therefore, any one of the first frequency value the second frequency value $f_{rm}$, and the frequency value corresponding to the maximum current amplitude may be taken as the resonant frequency.

If $f_{rm+2} - f_{rm} < T$ is not established, that is, the difference between the first frequency value $f_{rm+2}$ and the second frequency value $f_{rm}$ is greater than or equal to the preset threshold, the second frequency value $f_{rm}$ and the first frequency value $f_{rm+2}$ may be taken as a new reference frequency range, and a new reference step size may be determined according to the above discussion, that is, a reference step size corresponding to the current search, which is not described in detail herein. A plurality of frequency values are determined in the new reference frequency range according to the new reference step size, and the reference signal source is controlled to output reference voltage signals corresponding to the plurality of frequency values to obtain a current amplitude sequence. Next, it is determined whether a difference between a first frequency value corresponding to a subsequent current amplitude of a maximum current amplitude in the current amplitude sequence and a second frequency value corresponding to a previous current amplitude of the maximum current amplitude is less than the preset threshold. Searches are repeated until the difference between the first frequency value and the second frequency value is less than the preset threshold, so as to obtain the resonant frequency. For example, if the reference frequency range is [20, 200] and a search step size is 20 for the first search, a search frequency is [20, 40, 60, 80, 100, 120, 140, 160, 180, 200], the preset threshold is 3, and according to the above process, it is obtained that the first frequency value $f_{rm+2}$ is 140 and the second frequency value $f_{rm}$ is 100. In the second search, if a new reference frequency range is [100, 140] and a new search step size is 5, a search frequency is [100, 105, 110, 115, 120, 125, 130, 135, 140], it is obtained from the second search that the first frequency value $f_{rm+2}$ is 120 and the second frequency value $f_{rm}$ is 110. In the third search, if the new reference frequency range is [110, 120] and the new search step size is 1, a search frequency is [110, 111, 112, 113, 114, 115, 116, 117, 118, 119, 120], and it is obtained from the third search that the first frequency value $f_{rm+2}$ is 115 and the second frequency value $f_{rm}$, is 113. Since the difference between the first frequency value $f_{rm+2}$ and the second frequency value $f_{rm}$ is less than the preset threshold, any one of the first frequency value $f_{rm+2}$, the second frequency value $f_{rm}$, and the frequency value corresponding to the maximum current amplitude may be taken as the resonant frequency. That is, the resonant frequency may be 113, 114, or 115.

It is to be noted that the preset threshold in the above example is intended only to facilitate the description of the process of determining the resonant frequency in this embodiment. The preset threshold in this embodiment may be set to one tenth, one hundredth, or even one thousandth. In other words, an error of the resonant frequency obtained in this embodiment can be controlled within a small range, enabling the resonant frequency obtained to be closer to an actual resonant frequency of the electrical circuit, reducing a calculation error, and improving the accuracy of voltage measurement.

In this embodiment, the processor determines a plurality of frequency values in a reference frequency range according to a reference step size, controls the reference signal source to output reference voltage signals corresponding to the plurality of frequency values to obtain a current amplitude sequence, determines whether a difference between a first frequency value corresponding to a subsequent current amplitude of a maximum current amplitude in the current amplitude sequence and a second frequency value corresponding to a previous current amplitude of the maximum current amplitude is less than a preset threshold, and determines that any one of the first frequency value, the second frequency value, and the frequency value corresponding to the maximum current amplitude is the resonant frequency if the difference is less than the preset threshold. If the difference is greater than or equal to the preset threshold, the second frequency value and the first frequency value are taken as a new reference frequency range, and iterative processing is performed until the difference between the first frequency value and the second frequency value is less than the preset threshold. The iterative processing includes: determining a plurality of frequency values in the new reference frequency range according to a new reference step size, and controlling the reference signal source to output reference voltage signals corresponding to the plurality of frequency values to obtain a current amplitude sequence; and determining whether a difference between a first frequency value corresponding to a subsequent current amplitude of a maximum current amplitude in the current amplitude sequence and a second frequency value corresponding to a previous current amplitude of the maximum current amplitude is less than the preset threshold. In other words, in this embodiment, the resonant frequency of the electrical circuit is determined through continuous iterative search. With the method, a calculation speed of the processor can be increased, a calculation amount of the processor can be reduced, and a speed and accuracy of voltage measurement can be improved.

Figure 6:
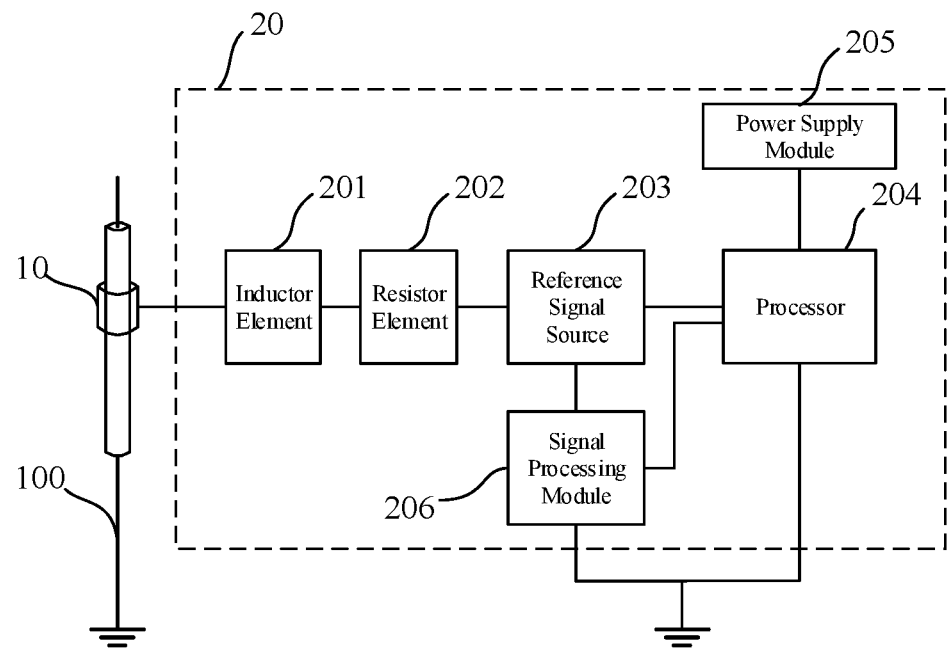
FIG. 6 is a schematic diagram illustrating a configuration of a voltage measurement device according to another embodiment.

In an embodiment, as shown in FIG. 6, the measurement unit in this embodiment further includes a signal processing module 206. The signal processing module 206 is connected in series in the electrical circuit. The signal processing module 206 is further connected to the processor. The signal processing module 206 is configured to detect a current signal in the electrical circuit, perform signal separation processing on the current signal, determine the first current component amplitude and the second current component amplitudes, and send the first current component amplitude and the second current component amplitudes to the processor. As can be known from the above discussion, the current in the electrical circuit is formed by superposition of a first current component under the action of the voltage of the alternating-current transmission line and second current components under the action of the reference voltage signals of the reference signal source. Therefore, signal separation processing can be performed on the current in the electrical circuit through the signal processing module 206 to obtain the first current component and the second current components. Then, the signal processing module 206 may further analyze the first current component to obtain a first current component amplitude and analyze the second current components to obtain second current component amplitudes. Next, the first current component amplitude and the second current component amplitudes are sent to the processor, so that the processor can perform related processing operations directly according to the first current component amplitude and the second current component amplitudes. In this way, data processing pressure of the processor is greatly reduced, and a processing rate of the processor is improved.

In an optional embodiment of the present disclosure, the signal processing module 206 may be an ammeter. That is, an ammeter is connected in series in the electrical circuit to perform signal separation processing on the current in the electrical circuit to obtain current amplitudes at two different frequencies and send the current amplitudes to the processor. The use of the ammeter can reduce hardware costs of the voltage measurement device in this embodiment and overall development costs of the voltage measurement device.

Figure 7:
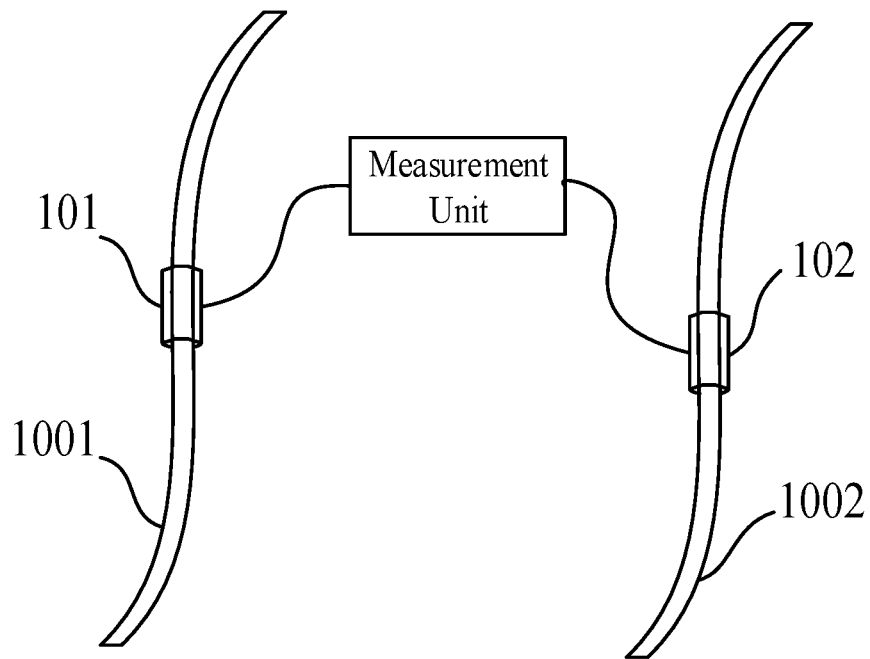
FIG. 7 is a schematic diagram illustrating a configuration of a voltage measurement device according to another embodiment.

In an embodiment, as shown in FIG. 7, the probe module 10 may include a first probe 101 and a second probe 102. The first probe 101 is connected to a live line 1001 (which is also known as phase line) of the alternating-current transmission line 100, and the second probe 102 is connected to a null line or earth line 1002 of the alternating-current transmission line 100. The metal electrode of the first probe 101 is electrically coupled with the live line 1001 to form a first coupling capacitor. The metal electrode of the second probe 102 is electrically coupled with the null line or earth line 1002 to form a second coupling capacitor. The first coupling capacitor and the second coupling capacitor may be equivalent to the coupling capacitor in FIG. 2. That is, the capacitance C of the coupling capacitor in FIG. 2 may be expressed as:

$$C = \frac{C_1 C_2}{C_1 + C_2} \quad (18)$$

where $C_1$ denotes the capacitance of the first coupling capacitor formed by electrical coupling between the metal electrode of the first probe and the live line, and $C_2$ denotes the capacitance of the second coupling capacitor formed by electrical coupling between the metal electrode of the second probe and the null line or earth line.

In this embodiment, with the arrangement of two probes, of which one is connected to a live line of the alternating-current transmission line and the other is connected to the null line or earth line of the alternating-current transmission line, in the connection manner in this embodiment, the effect of parasitic capacitance between the ground of the alternating-current transmission line and the ground of the measurement unit can be reduced and the accuracy of voltage measurement can be improved.

In an embodiment, the voltage measurement device further includes a shielding enclosure. The shielding enclosure encloses the probe module and the measurement unit. That is, the shielding enclosure may be arranged on an outer side of the probe (the side away from the alternating-current transmission line), and the shielding enclosure is arranged on the periphery of the measurement unit, so that the entire measuring device can be free from interference of an external environment and can also prevent a coupling phenomenon between the metal electrode in the probe and the external environment, reducing a measurement error and improving the accuracy of voltage measurement.

Figure 8:
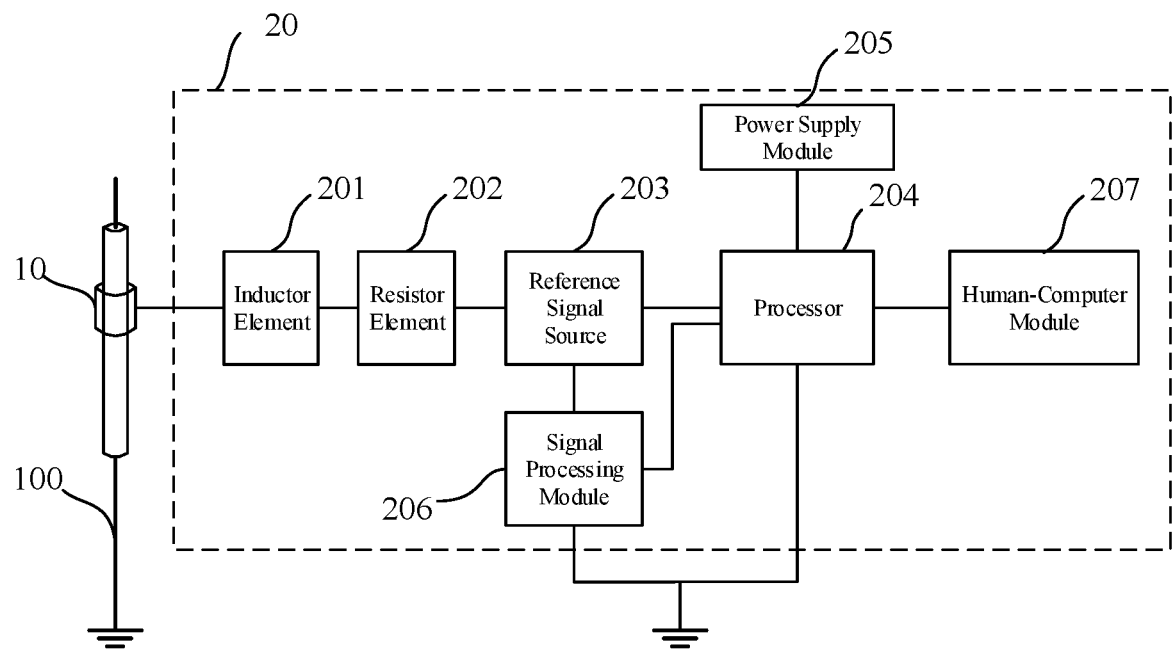
FIG. 8 is a schematic diagram illustrating a configuration of a voltage measurement device according to another embodiment.

In an embodiment, as shown in FIG. 8, the measurement unit further includes a human-computer module 207. The human-computer module 207 is connected to the processor and configured to output probe position information used to indicate a sub-circuit which the probe module is currently arranged around. The sub-circuit includes any two of the live line, the null line, and the earth line of the alternating-current transmission line. The human-computer module 207 is further configured to receive confirmation information entered by a user. The confirmation information is confirmation information of the probe position information. The processor is further configured to receive the confirmation information sent by the human-computer module 207, and in response to the confirmation information, control the reference signal source to input reference voltage signals at different frequencies to the electrical circuit to determine the voltage of the alternating-current transmission line.

Optionally, the human-computer module 207 may be a microphone, a display screen, or a combination of a microphone and a display screen. After the user arranges the probe around the alternating-current transmission line, the processor may output, through the human-computer module 207, a detected type of the sub-circuit which the probe module is currently arranged around, so that the user can understand, in real time, voltage information of which sub-circuit is currently detected and the user can easily check whether the two probes are correctly connected. In addition, the human-computer module 207 may further receive confirmation information entered by the user. After receiving the confirmation information, the processor responds to the confirmation information, that is, controls the reference signal source to input reference voltage signals at different frequencies to the electrical circuit, to determine the voltage of the alternating-current transmission line. Optionally, a measuring switch may also be arranged in the electrical circuit, and the processor, after receiving the confirmation information from the user, may control the measuring switch to be switched on to form an electrical circuit. Next, the processor may control the reference signal source to input reference voltage signals at different frequencies to the electrical circuit to determine the voltage of the alternating-current transmission line.

In this embodiment, the human-computer module is arranged in the measurement unit to output positions of the probes, so as to inform the user of the sub-circuit currently arranged around, and can further receive the user's confirmation information about the positions of the probes, response to the confirmation information, and then control the reference signal source to input reference voltage signals at different frequencies to the electrical circuit to determine the voltage of the alternating-current transmission line, which can ensure that the user performs correct arrangement of the probe for measurement on the voltage of the alternating-current transmission line, and can improve efficiency of voltage measurement, improve user experience, and improve operational convenience of the user.

In an embodiment, the human-computer module 207 is further configured to acquire a reference frequency range entered by the user. Optionally, the user may enter the reference frequency range through the human-computer module 207, so that the voltage measurement device can perform corresponding voltage measurement according to the user's requirement, which improves flexibility of use of the voltage measurement device and can increase an applicable range of the voltage measurement device. In addition, the human-computer module 207 is further configured to output the voltage of the alternating-current transmission line, that is, information the user in real time of the detected voltage of the alternating-current transmission line, so that the user can visually see a current voltage of the alternating-current transmission line, which provides convenience for the user. Optionally, the human-computer module 207 may also select displaying the current signal in the electrical circuit or a second current component under the action of the reference signal source and a first current component under the action of the alternating-current transmission line, or the like. The content that can be displayed by the human-computer module 207 is not limited in this embodiment.

In this embodiment, by adding the human-computer module on the periphery of the processor, voltage measurement related data obtained by the processor, especially the voltage of the alternating-current transmission line obtained by the processor, can be displayed, so as to provide convenience for the user, which improves user experience and convenience.

In an embodiment, the measurement unit may further include a communication module. The communication module is connected to the processor and configured to realize remote communication between the measurement unit in this embodiment and a further terminal or a server. That is, the voltage measurement related data obtained by the processor can be sent to the further terminal or server through the communication module, so that the further terminal or server can further process or display the voltage measurement related data to achieve data sharing.

Figure 9:
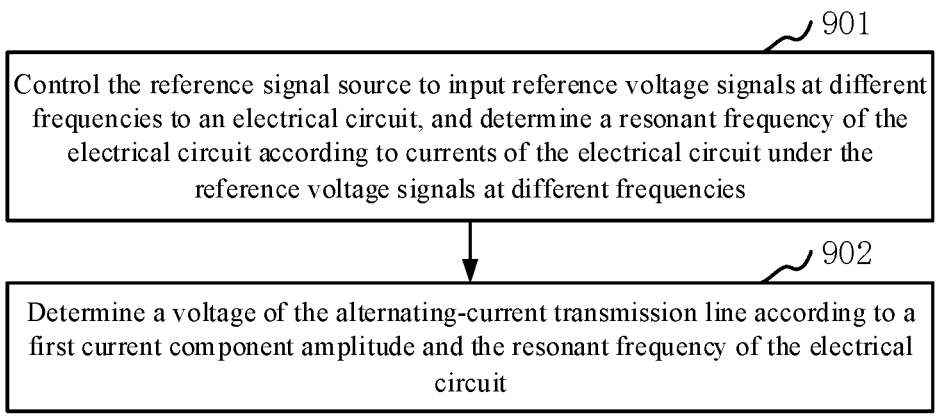
FIG. 9 is a flow diagram illustrating a voltage measurement method according to an embodiment.

In an embodiment, as shown in FIG. 9, a voltage measurement method applied to a voltage measurement device is provided. The voltage measurement device including a probe module and a measurement unit. The probe module is movably arranged around an outer insulating surface layer of an alternating-current transmission line. A metal electrode is arranged on a surface of the probe module facing toward the alternating-current transmission line. The measurement unit includes an inductor element, a resistor element, and a reference signal source. Referring to FIG. 1, for example, the method is applied to the processor in FIG. 1, including the following steps.

In step 901, the reference signal source is controlled to input reference voltage signals at different frequencies to an electrical circuit, and a resonant frequency of the electrical circuit is determined according to currents of the electrical circuit under the reference voltage signals at different frequencies.

The electrical circuit includes a coupling capacitor, an inductor element, a resistor element, and the reference signal source. The coupling capacitor is a capacitor formed by electrical coupling between the metal electrode and the alternating-current transmission line.

In step 902, a voltage of the alternating-current transmission line is determined according to a first current component amplitude and the resonant frequency of the electrical circuit.

The first current component amplitude is an amplitude of a current component corresponding to a frequency of the alternating-current transmission line in the current of the electrical circuit.

The steps of the voltage measurement method performed by the processor in this embodiment may be obtained with reference to the detailed discussion of a series of steps performed by the processor in each of the above embodiments of the voltage measurement device.

In this embodiment, the processor controls the reference signal source to input reference voltage signals at different frequencies to the electrical circuit, and determines the resonant frequency of the electrical circuit according to currents of the electrical circuit under the reference voltage signals at different frequencies. Next, the processor determines the voltage of the alternating-current transmission line according to the first current component amplitude and the resonant frequency of the electrical circuit. In other words, in the embodiment of the present disclosure, after the probe module is arranged around the alternating-current transmission line, the metal electrode of the probe module is electrically coupled with the alternating-current transmission line to form an electrical circuit, and then the processor controls the reference signal source to output reference voltage signals at different frequencies to determine a resonant frequency of the electrical circuit, so that the processor can determine the voltage of the alternating-current transmission line according to the resonant frequency and the first current component amplitude in the currents of the electrical circuit corresponding to the alternating-current transmission line. In this manner, the voltage of the alternating-current transmission line can be accurately calculated, and accuracy of measurement on the voltage of the alternating-current transmission line can be improved.

In an embodiment, step 902 may include: determining the voltage of the alternating-current transmission line according to the first current component amplitude, the resonant frequency, and a voltage calculation formula. The voltage calculation formula is a relation including $$\left[R + j2\pi L\left(f_s - \frac{f_{rset}^2}{f_s}\right)\right] \cdot I_s,$$

where $f_{rset}$ denotes the resonant frequency, $I_s$ denotes the first current component amplitude, $f_s$ denotes a power frequency, L denotes an inductance value of the inductor element, and R denotes a resistance value of the resistor element.

In an embodiment, step 901 may include: controlling the reference signal source to output a plurality of reference voltage signals at different frequencies, and determining second current component amplitudes respectively corresponding to the reference voltage signals at the different frequencies, the second current component amplitudes being amplitudes of current components respectively corresponding to the frequencies of the reference voltage signals in the currents of the electrical circuit; and determining the resonant frequency of the electrical circuit according to the second current component amplitudes and a preset search algorithm.

In an embodiment, step 902 may include: determining a plurality of frequency values in a reference frequency range according to a reference step size, and controlling the reference signal source to output reference voltage signals corresponding to the plurality of frequency values to obtain a current amplitude sequence; the current amplitude sequence including second current component amplitudes respectively corresponding to the reference voltage signals; determining whether a difference between a first frequency value corresponding to a subsequent current amplitude of a maximum current amplitude in the current amplitude sequence and a second frequency value corresponding to a previous current amplitude of the maximum current amplitude is less than a preset threshold; and determining that any one of the first frequency value, the second frequency value, and the frequency value corresponding to the maximum current amplitude is the resonant frequency if the difference is less than the preset threshold.

In an embodiment, step 902 may further include: taking, if the difference is greater than or equal to the preset threshold, the second frequency value and the first frequency value as a new reference frequency range, and performing iterative processing until the difference between the first frequency value and the second frequency value is less than the preset threshold. The iterative processing includes: determining a plurality of frequency values in the new reference frequency range according to a new reference step size, and controlling the reference signal source to output reference voltage signals corresponding to the plurality of frequency values to obtain a current amplitude sequence; and determining whether a difference between a first frequency value corresponding to a subsequent current amplitude of a maximum current amplitude in the current amplitude sequence and a second frequency value corresponding to a previous current amplitude of the maximum current amplitude is less than the preset threshold.

In an embodiment, the method further includes: sending, by the processor, probe position information to a human-computer module to cause the human-computer module to output the probe position information used to indicate a sub-circuit which the probe module is currently arranged around; the sub-circuit being any two of the live line, the null line, and the earth line of the alternating-current transmission line; and receiving confirmation information sent by the human-computer module, and in response to the confirmation information, controlling the reference signal source to input reference voltage signals at different frequencies to the electrical circuit to determine the voltage of the alternating-current transmission line.

In an embodiment, the method further includes: receiving, by the processor, a reference frequency range entered by the user sent by the human-computer module, and controlling the reference signal source to input reference voltage signals at different frequencies to the electrical circuit according to the reference frequency range to determine a voltage of the alternating-current transmission line; and sending the voltage of the alternating-current transmission line to the human-computer module to enable the human-computer module to output the voltage of the alternating-current transmission line.

It should be understood that, although the steps in the flow diagram of FIG. 9 are shown in sequence as indicated by the arrows, the steps are not necessarily performed in the order indicated by the arrows. Unless otherwise clearly specified herein, the steps are performed without any strict sequence limitation, and may be performed in other orders. In addition, at least some steps in FIG. 9 may include a plurality of steps or a plurality of stages, and such steps or stages are not necessarily performed at a same moment, and may be performed at different moments. The steps or stages may be performed alternately with other steps or at least part of the steps or stages of other steps, rather than being necessarily performed sequentially.

Figure 10:
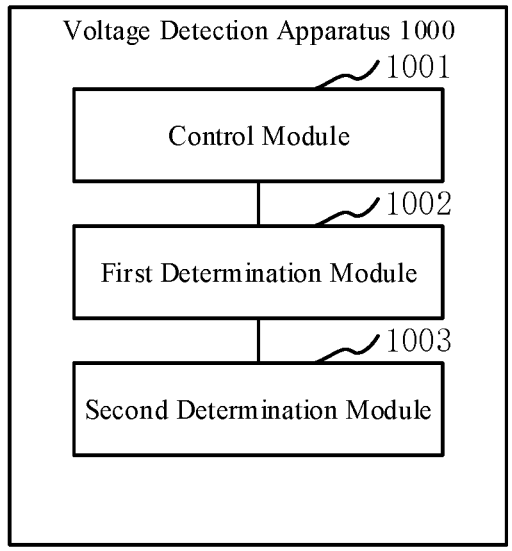
FIG. 10 is a block diagram illustrating a configuration of a voltage measurement device according to an embodiment.

In an embodiment, as shown in FIG. 10, a voltage measurement device is provided, including: a control module 1010, a first determination module 1020, and a second determination module 1030.

The control module 1010 is configured to control a reference signal source to input reference voltage signals at different frequencies to an electrical circuit.

The first determination module 1020 is configured to determine a resonant frequency of the electrical circuit according to currents of the electrical circuit under the reference voltage signals at different frequencies. The electrical circuit includes a coupling capacitor, an inductor element, a resistor element, and the reference signal source. The coupling capacitor is a capacitor formed by electrical coupling between a metal electrode and an alternating-current transmission line.

The second determination module 1030 is configured to determine a voltage of the alternating-current transmission line according to a first current component amplitude and the resonant frequency of the electrical circuit. The first current component amplitude is an amplitude of a current component corresponding to a frequency of the alternating-current transmission line in the current of the electrical circuit.

In an embodiment, the second determination module 1030 is specifically configured to determine the voltage of the alternating-current transmission line according to the first current component amplitude, the resonant frequency, and a voltage calculation formula. The voltage calculation formula is a relation including $$\left[R + j2\pi L\left(f_s - \frac{f_{rset}^2}{f_s}\right)\right] \cdot I_s,$$

where $f_{rset}$ denotes the resonant frequency, $I_s$ denotes the first current component amplitude, $f_s$ denotes a power frequency, L denotes an inductance value of the inductor element, and R denotes a resistance value of the resistor element.

In an embodiment, the control module 1010 is specifically configured to control the reference signal source to output a plurality of reference voltage signals at different frequencies, and determine second current component amplitudes respectively corresponding to the reference voltage signals at the different frequencies. The second current component amplitudes are amplitudes of current components respectively corresponding to the frequencies of the reference voltage signals in the currents of the electrical circuit. The first determination module 1020 is specifically configured to determine the resonant frequency of the electrical circuit according to the second current component amplitudes and a preset search algorithm.

In an embodiment, the control module 1010 includes a frequency determination unit and a signal control unit. The frequency determination unit is configured to determine a plurality of frequency values in a reference frequency range according to a reference step size. The signal control unit is configured to control the reference signal source to output reference voltage signals corresponding to the plurality of frequency values to obtain a current amplitude sequence. The current amplitude sequence includes second current component amplitudes respectively corresponding to the reference voltage signals. The first determination module 1020 is specifically configured to determine whether a difference between a first frequency value corresponding to a subsequent current amplitude of a maximum current amplitude in the current amplitude sequence and a second frequency value corresponding to a previous current amplitude of the maximum current amplitude is less than a preset threshold; and determine that any one of the first frequency value, the second frequency value, and the frequency value corresponding to the maximum current amplitude is the resonant frequency if the difference is less than the preset threshold.

In an embodiment, the first determination module 1020 is further configured to take, if the difference is greater than or equal to the preset threshold, the second frequency value and the first frequency value as a new reference frequency range, and perform iterative processing until the difference between the first frequency value and the second frequency value is less than the preset threshold. The iterative processing includes: determining a plurality of frequency values in the new reference frequency range according to a new reference step size, and controlling the reference signal source to output reference voltage signals corresponding to the plurality of frequency values to obtain a current amplitude sequence; and determining whether a difference between a first frequency value corresponding to a subsequent current amplitude of a maximum current amplitude in the current amplitude sequence and a second frequency value corresponding to a previous current amplitude of the maximum current amplitude is less than the preset threshold.

In an embodiment, the device further includes a sending module and a receiving module. The sending module is configured to send probe position information to a human-computer module to cause the human-computer module to output the probe position information used to indicate a sub-circuit which the probe module is currently arranged around. The sub-circuit includes any two of the live line, the null line, and the earth line of the alternating-current transmission line. The receiving module is configured to receive confirmation information sent by the human-computer module, and in response to the confirmation information, control the reference signal source to input reference voltage signals at different frequencies to the electrical circuit to determine the voltage of the alternating-current transmission line.

In an embodiment, the receiving module is further configured to receive a reference frequency range entered by the user sent by the human-computer module, and control the reference signal source to input reference voltage signals at different frequencies to the electrical circuit according to the reference frequency range to determine a voltage of the alternating-current transmission line. The sending module is further configured to send the voltage of the alternating-current transmission line to the human-computer module to enable the human-computer module to output the voltage of the alternating-current transmission line.

Specific limitations on the voltage measurement device may be obtained with reference to the limitations on the voltage measurement method hereinabove. Details are not described herein. The modules in the foregoing voltage measurement device may be implemented entirely or partially by software, hardware, or a combination thereof. The above modules may be built in or independent of a processor of a computer device in a hardware form, or may be stored in a memory of the computer device in a software form, so that the processor invokes and performs operations corresponding to the above modules.

Figure 11:
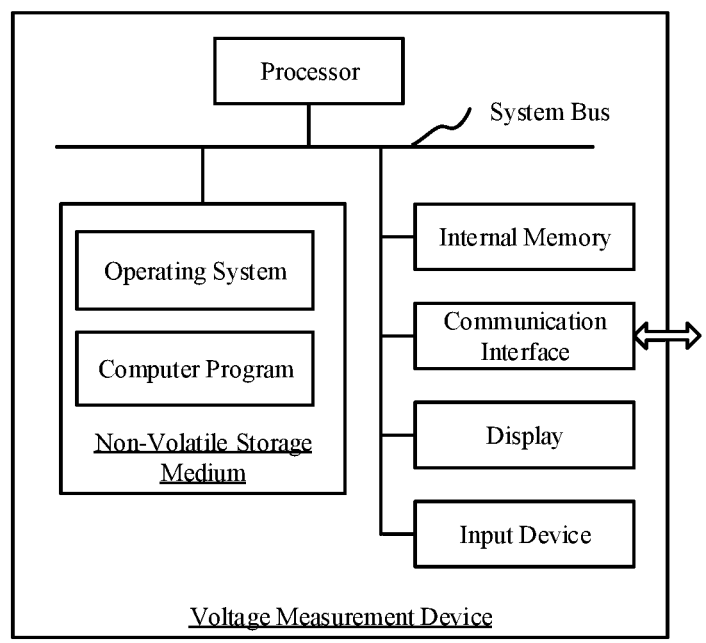
FIG. 11 is a schematic diagram illustrating an internal configuration of the voltage measurement device according to an embodiment.

In an embodiment, a voltage measurement device is provided, an internal configuration of which may be shown in FIG. 11. The voltage measurement device includes a processor, a memory, a communication interface, a display screen, and an Input device that are connected via a system bus. The processor of the voltage measurement device is configured to provide computing and control capabilities. The memory of the voltage measurement device includes a non-volatile storage medium and an internal memory. The non-volatile storage medium stores an operating system and a computer program. The internal memory provides an environment for running of the operating system and the computer program in the non-volatile storage medium. The communication interface of the voltage measurement device is configured to conduct communication with an external terminal in a wired or wireless manner. The wireless manner may be implemented by Wi-Fi, a service provider network, near field communication (NFC), or other technologies. The computer program is executed by the processor to implement the voltage measurement process. The display screen of the voltage measurement device may be a liquid crystal display screen or an electronic ink display screen. The input device of the voltage measurement device may be a touch layer covering the display screen, or may be a key, a trackball, or a touchpad provided on a housing of the voltage measurement device, or may be an external keyboard, touchpad, mouse, or the like.

Those skilled in the art may understand that, in the structure shown in FIG. 11, only a block diagram of a partial structure related to a solution of the present disclosure is shown, which does not constitute a limitation on the computer device to which the solution of the present disclosure is applied. Specifically, the computer device may include more or fewer components than those shown in the figure, or some components may be combined, or a different component arrangement may be used.

In an embodiment, a voltage measurement device is provided, including a memory and a processor. The memory stores a computer program. The processor, when executing the computer program, performs the following steps:

controlling the reference signal source to input reference voltage signals at different frequencies to an electrical circuit, and determining a resonant frequency of the electrical circuit according to currents of the electrical circuit under the reference voltage signals at different frequencies, the electrical circuit including a coupling capacitor, the inductor element, the resistor element, and the reference signal source, the coupling capacitor being a capacitor formed by electrical coupling between the metal electrode and the alternating-current transmission line; and determining a voltage of the alternating-current transmission line according to a first current component amplitude and the resonant frequency of the electrical circuit; the first current component amplitude being an amplitude of a current component corresponding to a frequency of the alternating-current transmission line in the current of the electrical circuit.

In an embodiment, the processor, when executing the computer program, further performs the following step: determining the voltage of the alternating-current transmission line according to the first current component amplitude, the resonant frequency, and a voltage calculation formula. The voltage calculation formula is a relation including $$\left[R + j2\pi L\left(f_s - \frac{f_{rset}^2}{f_s}\right)\right] \cdot I_s,$$

where $f_{rset}$ denotes the resonant frequency, $I_s$ denotes the first current component amplitude, $f_s$ denotes a power frequency, L denotes an inductance value of the inductor element, and R denotes a resistance value of the resistor element.

In an embodiment, the processor, when executing the computer program, further performs the following steps: controlling the reference signal source to output a plurality of reference voltage signals at different frequencies, and determining second current component amplitudes respectively corresponding to the reference voltage signals at the different frequencies, the second current component amplitudes being amplitudes of current components respectively corresponding to the frequencies of the reference voltage signals in the currents of the electrical circuit; and determining the resonant frequency of the electrical circuit according to the second current component amplitudes and a preset search algorithm.

In an embodiment, the processor, when executing the computer program, further performs the following steps: determining a plurality of frequency values in a reference frequency range according to a reference step size, and controlling the reference signal source to output reference voltage signals corresponding to the plurality of frequency values to obtain a current amplitude sequence; the current amplitude sequence including second current component amplitudes respectively corresponding to the reference voltage signals; determining whether a difference between a first frequency value corresponding to a subsequent current amplitude of a maximum current amplitude in the current amplitude sequence and a second frequency value corresponding to a previous current amplitude of the maximum current amplitude is less than a preset threshold; and determining that any one of the first frequency value, the second frequency value, and the frequency value corresponding to the maximum current amplitude is the resonant frequency if the difference is less than the preset threshold.

In an embodiment, the processor, when executing the computer program, further performs the following step: taking, if the difference is greater than or equal to the preset threshold, the second frequency value and the first frequency value as a new reference frequency range, and performing iterative processing until the difference between the first frequency value and the second frequency value is less than the preset threshold. The iterative processing includes: determining a plurality of frequency values in the new reference frequency range according to a new reference step size, and controlling the reference signal source to output reference voltage signals corresponding to the plurality of frequency values to obtain a current amplitude sequence; and determining whether a difference between a first frequency value corresponding to a subsequent current amplitude of a maximum current amplitude in the current amplitude sequence and a second frequency value corresponding to a previous current amplitude of the maximum current amplitude is less than the preset threshold.

In an embodiment, the processor, when executing the computer program, further performs the following steps: sending probe position information to a human-computer module to cause the human-computer module to output the probe position information used to indicate a sub-circuit which the probe module is currently arranged around, the sub-circuit being any two of the live line, the null line, and the earth line of the alternating-current transmission line; and receiving confirmation information sent by the human-computer module, and in response to the confirmation information, controlling the reference signal source to input reference voltage signals at different frequencies to the electrical circuit to determine the voltage of the alternating-current transmission line.

In an embodiment, the processor, when executing the computer program, further performs the following steps: receiving a reference frequency range entered by the user sent by the human-computer module, and controlling the reference signal source to input reference voltage signals at different frequencies to the electrical circuit according to the reference frequency range to determine a voltage of the alternating-current transmission line; and sending the voltage of the alternating-current transmission line to the human-computer module to enable the human-computer module to output the voltage of the alternating-current transmission line.

In an embodiment, a computer-readable storage medium storing a computer program is provided. The computer program, when executed by a processor, causes the processor to perform the following steps:

controlling the reference signal source to input reference voltage signals at different frequencies to an electrical circuit, and determining a resonant frequency of the electrical circuit according to currents of the electrical circuit under the reference voltage signals at different frequencies, the electrical circuit including a coupling capacitor, the inductor element, the resistor element, and the reference signal source, the coupling capacitor being a capacitor formed by electrical coupling between the metal electrode and the alternating-current transmission line; and determining a voltage of the alternating-current transmission line according to a first current component amplitude and the resonant frequency of the electrical circuit; the first current component amplitude being an amplitude of a current component corresponding to a frequency of the alternating-current transmission line in the current of the electrical circuit.

In an embodiment, the computer program, when executed by a processor, causes the processor to further perform the following step: determining the voltage of the alternating-current transmission line according to the first current component amplitude, the resonant frequency, and a voltage calculation formula. The voltage calculation formula is a relation including $$\left[R + j2\pi L\left(f_s - \frac{f_{rset}^2}{f_s}\right)\right] \cdot I_s,$$

where $f_{rset}$ denotes the resonant frequency, $I_s$ denotes the first current component amplitude, $f_s$ denotes a power frequency, L denotes an inductance value of the inductor element, and R denotes a resistance value of the resistor element.

In an embodiment, the computer program, when executed by a processor, causes the processor to further perform the following steps: controlling the reference signal source to output a plurality of reference voltage signals at different frequencies, and determining second current component amplitudes respectively corresponding to the reference voltage signals at the different frequencies, the second current component amplitudes being amplitudes of current components respectively corresponding to the frequencies of the reference voltage signals in the currents of the electrical circuit; and determining the resonant frequency of the electrical circuit according to the second current component amplitudes and a preset search algorithm.

In an embodiment, the computer program, when executed by a processor, causes the processor to further perform the following steps: determining a plurality of frequency values in a reference frequency range according to a reference step size, and controlling the reference signal source to output reference voltage signals corresponding to the plurality of frequency values to obtain a current amplitude sequence, the current amplitude sequence including second current component amplitudes respectively corresponding to the reference voltage signals; determining whether a difference between a first frequency value corresponding to a subsequent current amplitude of a maximum current amplitude in the current amplitude sequence and a second frequency value corresponding to a previous current amplitude of the maximum current amplitude is less than a preset threshold; and determining that any one of the first frequency value, the second frequency value, and the frequency value corresponding to the maximum current amplitude is the resonant frequency if the difference is less than the preset threshold.

In an embodiment, the computer program, when executed by a processor, causes the processor to further perform the following step: taking, if the difference is greater than or equal to the preset threshold, the second frequency value and the first frequency value as a new reference frequency range, and performing iterative processing until the difference between the first frequency value and the second frequency value is less than the preset threshold. The iterative processing includes: determining a plurality of frequency values in the new reference frequency range according to a new reference step size, and controlling the reference signal source to output reference voltage signals corresponding to the plurality of frequency values to obtain a current amplitude sequence; and determining whether a difference between a first frequency value corresponding to a subsequent current amplitude of a maximum current amplitude in the current amplitude sequence and a second frequency value corresponding to a previous current amplitude of the maximum current amplitude is less than the preset threshold.

In an embodiment, the computer program, when executed by a processor, causes the processor to further perform the following steps: sending probe position information to a human-computer module to cause the human-computer module to output the probe position information used to indicate a sub-circuit which the probe module is currently arranged around, the sub-circuit being any two of the live line, the null line, and the earth line of the alternating-current transmission line; and receiving confirmation information sent by the human-computer module, and in response to the confirmation information, controlling the reference signal source to input reference voltage signals at different frequencies to the electrical circuit to determine the voltage of the alternating-current transmission line.

In an embodiment, the computer program, when executed by a processor, causes the processor to further perform the following steps: receiving a reference frequency range entered by the user sent by the human-computer module, and controlling the reference signal source to input reference voltage signals at different frequencies to the electrical circuit according to the reference frequency range to determine a voltage of the alternating-current transmission line; and sending the voltage of the alternating-current transmission line to the human-computer module to enable the human-computer module to output the voltage of the alternating-current transmission line.

Those of ordinary skill in the art may understand that some or all procedures in the methods in the above embodiments may be implemented by a computer program instructing related hardware, the computer program may be stored in a non-volatile computer-readable storage medium, and when the computer program is executed, the procedures in the above method embodiments may be implemented. Any reference to a memory, a storage, a database, or other media used in the embodiments provided in the present disclosure may include at least one of a non-volatile memory and a volatile memory. The non-volatile memory may include a read-only memory (ROM), a magnetic tape, a floppy disk, a flash memory, an optical memory or the like. The volatile memory may include a random access memory (RAM) or an external high-speed cache memory. By way of illustration and not limitation, the RAM is available in a variety of forms, such as a static RAM (SRAM) or a dynamic RAM (DRAM).

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present disclosure, which are described specifically and in detail, and therefore cannot be construed as a limitation on the patent scope of the invention. It should be pointed out that those of ordinary skill in the art may also make several changes and improvements without departing from the ideas of the present disclosure, all of which fall within the protection scope of the present disclosure. Therefore, the patent protection scope of the present disclosure shall be subject to the appended claims.

What is claimed is:

1. A voltage measurement device, comprising a probe module and a measurement unit, wherein the probe module is movably arranged around an outer insulating surface layer of an alternating-current transmission line, a metal electrode is arranged on a surface of the probe module facing toward the alternating-current transmission line, and the measurement unit includes an inductor element, a resistor element, a reference signal source, and a processor; and
wherein the processor is configured to:
determine a plurality of frequencies in a reference frequency range based on a reference step size;
control the reference signal source to input reference voltage signals at the plurality of frequencies to an electrical circuit, the electrical circuit including a coupling capacitor, the inductor element, the resistor element, and the reference signal source, the coupling capacitor being a capacitor formed by electrical coupling between the metal electrode and the alternating-current transmission line;
determine a first current component amplitude, the first current component amplitude being an amplitude of a current component corresponding to a frequency of the alternating-current transmission line in the current of the electrical circuit;
determine second current component amplitudes respectively corresponding to the reference voltage signals at the plurality of frequencies, the second current component amplitudes being amplitudes of current components respectively corresponding to the frequencies of the reference voltage signals in the current of the electrical circuit;
obtain a current amplitude sequence including the second current component amplitudes respectively corresponding to the reference voltage signals at the plurality of frequencies;
determine whether a difference between a first frequency value corresponding to a subsequent current amplitude of a maximum current amplitude in the current amplitude sequence and a second frequency value corresponding to a previous current amplitude of the maximum current amplitude is less than a preset threshold;
determine, when the difference is less than the preset threshold, any one of the first frequency value, the second frequency value, and a frequency value corresponding to the maximum current amplitude as a resonant frequency of the electrical circuit; and
determine, based on the first current component amplitude and the resonant frequency of the electrical circuit, a voltage of the alternating-current transmission line.

2. The device according to claim 1, wherein the processor is configured to determine, based on the first current component amplitude and the resonant frequency of the electrical circuit, the voltage of the alternating-current transmission line according to a voltage calculation formula, the voltage calculation formula being a relation including $$\left[R + j2\pi L\left(f_s - \frac{f_{rset}^2}{f_s}\right)\right] \cdot I_s,$$

where $f_{rset}$ denotes the resonant frequency, $I_s$ denotes the first current component amplitude, $f_s$ denotes a power frequency, L denotes an inductance value of the inductor element, and R denotes a resistance value of the resistor element.

3. The device according to claim 1, wherein the processor is configured to:
take, when the difference is greater than or equal to the preset threshold, the second frequency value and the first frequency value as a new reference frequency range; and
perform, based on the new reference frequency range, iterative processing until the difference between the first frequency value and the second frequency value is less than the preset threshold; and
wherein the iterative processing includes: determining a plurality of frequency values in the new reference frequency range based on a new reference step size, and controlling the reference signal source to output reference voltage signals corresponding to the plurality of frequency values to obtain a current amplitude sequence; and determining whether a difference between a first frequency value corresponding to a subsequent current amplitude of a maximum current amplitude in the current amplitude sequence and a second frequency value corresponding to a previous current amplitude of the maximum current amplitude is less than the preset threshold.

4. The device according to claim 1, wherein the measurement unit further includes a signal processing module connected in series in the electrical circuit, and further connected to the processor; and
wherein the signal processing module is configured to detect a current signal in the electrical circuit, perform signal separation processing on the current signal, determine the first current component amplitude and the second current component amplitudes, and send the first current component amplitude and the second current component amplitudes to the processor.

5. The device according to claim 1, wherein the probe module includes a first probe connected to a live line of the alternating-current transmission line, and a second probe connected to a null line or earth line of the alternating-current transmission line; and
wherein the metal electrode of the first probe is electrically coupled with the live line to form a first coupling capacitor, and the metal electrode of the second probe is electrically coupled with the null line or earth line to form a second coupling capacitor.

6. The device according to claim 1, wherein the voltage measurement device further includes a shielding enclosure enclosing the probe module and the measurement unit.

7. The device according to claim 5, wherein the measurement unit further includes a human-computer module connected to the processor and configured to output probe position information used to indicate a sub-circuit which the probe module is currently arranged around, the sub-circuit including any two of the live line, the null line, and the earth line of the alternating-current transmission line;
wherein the human-computer module is further configured to receive confirmation information entered by a user, the confirmation information being confirmation information of the probe position information; and
wherein the processor is further configured to receive the confirmation information sent by the human-computer module, and in response to the confirmation information, control the reference signal source to input reference voltage signals at different frequencies to the electrical circuit to determine the voltage of the alternating-current transmission line.

8. The device according to claim 7, wherein the human-computer module is further configured to acquire a reference frequency range entered by the user; and
wherein the human-computer module is further configured to output the voltage of the alternating-current transmission line.

9. A voltage measurement method applied to a voltage measurement device including a probe module and a measurement unit, the probe module movably arranged around an outer insulating surface layer of an alternating-current transmission line, a metal electrode being arranged on a surface of the probe module facing toward the alternating-current transmission line, and the measurement unit including an inductor element, a resistor element, and a reference signal source, the method comprising:
determining a plurality of frequencies in a reference frequency range based on a reference step size;
controlling the reference signal source to input reference voltage signals at the plurality of frequencies to an electrical circuit, wherein the electrical circuit includes a coupling capacitor, the inductor element, the resistor element, and the reference signal source, and the coupling capacitor is a capacitor formed by electrical coupling between the metal electrode and the alternating-current transmission line;
determining second current component amplitudes respectively corresponding to the reference voltage signals at the plurality of frequencies, the second current component amplitudes being amplitudes of current components respectively corresponding to the frequencies of the reference voltage signals in the current of the electrical circuit;
obtaining a current amplitude sequence including the second current component amplitudes respectively corresponding to the reference voltage signals at the plurality of frequencies;
determining whether a difference between a first frequency value corresponding to a subsequent current amplitude of a maximum current amplitude in the current amplitude sequence and a second frequency value corresponding to a previous current amplitude of the maximum current amplitude is less than a preset threshold;
determining, when the difference is less than the preset threshold, any one of the first frequency value, the second frequency value, and a frequency value corresponding to the maximum current amplitude as a resonant frequency of the electrical circuit; and
determining, based on the first current component amplitude and the resonant frequency of the electrical circuit, a voltage of the alternating-current transmission line.

10. A non-volatile computer-readable storage medium, storing a computer program, wherein the computer program, when executed by a processor, causes the processor to perform steps of the method according to claim 9.

* * * * *